(12) United States Patent
Yan (10) Patent No.: US 12,150,296 B2
(45) Date of Patent: Nov. 19, 2024

(54) METHOD FOR MANUFACTURING SEMICONDUCTOR BIT LINE CONTACT REGION WITH DIFFERENT DOPED IMPURITY CONCENTRATIONS

(71) Applicant: CHANGXIN MEMORY TECHNOLOGIES, INC., Hefei (CN)

(72) Inventor: Xun Yan, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 296 days.

(21) Appl. No.: 17/805,738

(22) Filed: Jun. 7, 2022

(65) Prior Publication Data

US 2023/0114038 A1 Apr. 13, 2023

Related U.S. Application Data

(63) Continuation of application No. PCT/CN2022/071263, filed on Jan. 11, 2022.

(30) Foreign Application Priority Data

Oct. 13, 2021 (CN) .......................... 202111192543.4

(51) Int. Cl.
H10B 12/00 (2023.01)

(52) U.S. Cl.
CPC ........... *H10B 12/482* (2023.02); *H10B 12/03* (2023.02); *H10B 12/09* (2023.02); *H10B 12/485* (2023.02)

(58) Field of Classification Search
CPC ................ H10B 12/482; H10B 12/485; H01L 21/823475
USPC ........................................................ 438/262
See application file for complete search history.

(56) References Cited

U.S. PATENT DOCUMENTS

| | | | |
|---|---|---|---|
| 8,026,604 B2* | 9/2011 | Kim ..................... | H10B 12/485 |
| | | | 438/618 |
| 10,546,863 B1 | 1/2020 | Kobayashi | |
| 2020/0127103 A1 | 4/2020 | Kim et al. | |

FOREIGN PATENT DOCUMENTS

| | | |
|---|---|---|
| CN | 103855002 A | 6/2014 |
| CN | 108962894 A | 12/2018 |
| CN | 111430226 A | 7/2020 |
| CN | 112530946 A | 3/2021 |
| CN | 113314469 A | 8/2021 |

(Continued)

OTHER PUBLICATIONS

European Search Report cited in EP22782646.8 mailed Oct. 30, 2023, 25 pages.

(Continued)

*Primary Examiner* — Hoai V Pham
(74) *Attorney, Agent, or Firm* — Kilpatrick Townsend & Stockton LLP (57) ABSTRACT

The present disclosure relates to the technical field of semiconductors, and provides a semiconductor structure and a manufacturing method thereof. The manufacturing method of a semiconductor structure includes: providing a substrate having bit line contact regions; and forming a first conductive layer and a second conductive layer in each of the bit line contact regions. In the present disclosure, a first conductive layer and a second conductive layer are formed through two deposition processes separately, and a concentration of doped impurities in the first conductive layer is lower than a concentration of doped impurities in the second conductive layer.

14 Claims, 5 Drawing Sheets

(56) References Cited

FOREIGN PATENT DOCUMENTS

CN      113658918 A      11/2021
JP      H11176936 A       7/1999

OTHER PUBLICATIONS

International Search Report cited in PCT/CN2022/071263 mailed Apr. 28, 2022, 11 pages.

\* cited by examiner

METHOD FOR MANUFACTURING SEMICONDUCTOR BIT LINE CONTACT REGION WITH DIFFERENT DOPED IMPURITY CONCENTRATIONS

CROSS-REFERENCE TO RELATED APPLICATIONS

The present disclosure is a continuation application of International Patent Application No. PCT/CN2022/071263, filed on Jan. 11, 2022, which claims the priority to Chinese Patent Application 202111192543.4, titled "SEMICONDUCTOR STRUCTURE AND MANUFACTURING METHOD THEREOF" and filed with the China National Intellectual Property Administration (CNIPA) on Oct. 13, 2021. The entire contents of International Patent Application No. PCT/CN2022/071263 and Chinese Patent Application 202111192543.4 are incorporated herein by reference.

TECHNICAL FIELD

The present disclosure relates to the technical field of semiconductors, and in particular to a semiconductor structure and a manufacturing method thereof.

BACKGROUND

A dynamic random access memory (DRAM) is a semiconductor memory that randomly writes and reads data at a high speed, and is widely used in data storage devices or apparatuses.

A DRAM generally includes a plurality of memory cells, each of which includes a transistor and a capacitor. The transistor includes a gate electrically connected to a word line, a source electrically connected to a bit line through a bit line contact structure, and a drain electrically connected to a capacitor through a capacitor contact. A word line voltage on the word line can control the on or off of the transistor, so as to read data information stored in the capacitor or write data information into the capacitor.

However, during forming of the bit line contact structure, a gap easily appears in the bit line contact structure, which may cause an electric connection between the capacitor contact structure and the bit line, thus reducing the yield of the semiconductor structure.

SUMMARY

According to a first aspect, an embodiment of the present disclosure provides a manufacturing method of a semiconductor structure, including:
- providing a substrate, where a plurality of bit line contact regions arranged at intervals are provided in the substrate;
- forming a first conductive layer in each of the bit line contact regions, where the first conductive layer defines a contact hole in each of the bit line contact regions; and
- forming a second conductive layer in each of the contact holes, where the second conductive layer and the first conductive layer form a conductive layer, and a concentration of doped impurities in the second conductive layer is higher than a concentration of doped impurities in the first conductive layer.

According to a second aspect, an embodiment of the present disclosure provides a semiconductor structure, which is manufactured using the manufacturing method of a semiconductor structure in the foregoing embodiment.

BRIEF DESCRIPTION OF THE DRAWINGS

To describe the technical solutions in the embodiments of the present disclosure or in the prior art more clearly, the following briefly describes the drawings required for describing the embodiments or the prior art. Apparently, the drawings in the following description show some embodiments of the present disclosure, and those of ordinary skill in the art may still derive other drawings from these drawings without creative efforts.

DETAILED DESCRIPTION

In a manufacturing process of a semiconductor structure, generally, bit line structures and isolation side walls covering the bit line structures are formed first. The bit line structure includes a bit line contact structure and a bit line that are sequentially stacked. After the bit line structures and the isolation side walls are formed, a capacitor contact structure is formed between adjacent isolation side walls. The capacitor contact structure is configured to connect a capacitor and an active region of the substrate, to implement storage of data.

Figure 1:
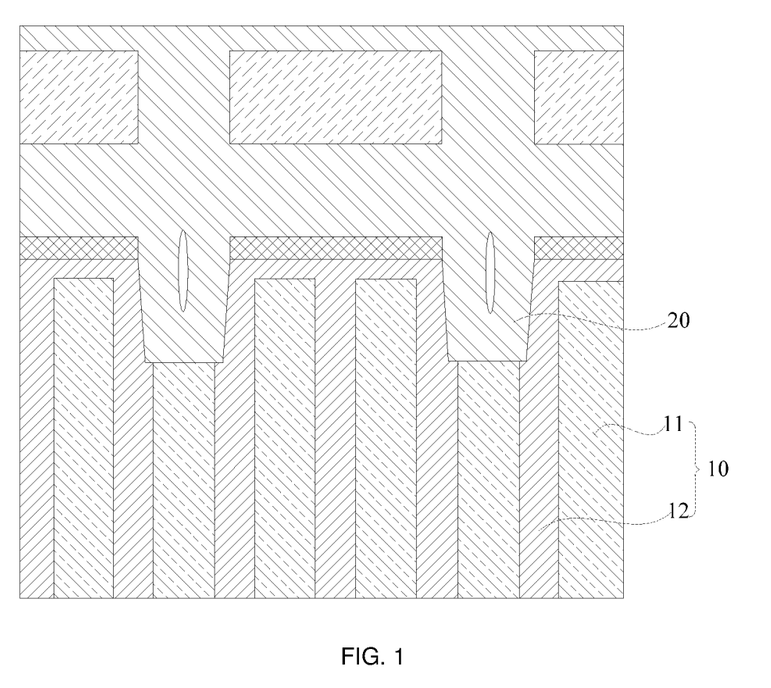
FIG. 1 is a first schematic structural diagram of a semiconductor structure according to the related art.
Figure 2:
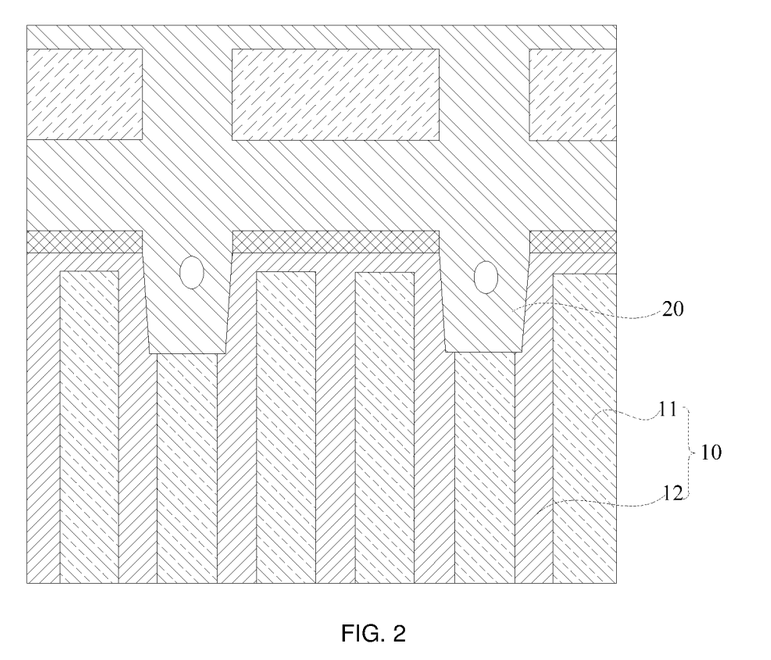
FIG. 2 is a second schematic structural diagram of a semiconductor structure according to the related art.

As shown in FIG. 1 and FIG. 2, during forming of the bit line contact structure, a bit line contact region is first formed in the substrate 10, and then a conductive layer 20 is formed in the bit line contact region. However, due to a large depth-to-width ratio of the bit line contact region, a gap will be formed in the conductive layer 20. When the conductive layer 20 is etched to form the bit line contact structure, the gap will be exposed, causing some regions of the bit line contact structure to be discontinuous, and during forming of the isolation side wall, an insulating material for forming the isolation side wall will be filled into the gap. Consequently, the isolation side wall is broken at the gap, and fails to cover the bit line completely. Correspondingly, when the capacitor contact structure is formed subsequently, an electric connection easily occurs between the capacitor contact structure and the bit line structure, reducing the yield of the semiconductor structure.

To solve the foregoing technical problem, in the embodiments of the present disclosure, a first conductive layer and a second conductive layer are formed through two deposition processes separately, and a concentration of doped impurities in the first conductive layer is lower than a concentration of doped impurities in the second is conductive layer. Because a lower concentration of doped impurities corresponds to a higher filling capability, no gap is formed during forming of the first conductive layer. In addition, a contact hole is defined in a bit line contact region of the first conductive layer, and the contact hole has a low depth-to-width ratio. In this way, during forming of the second conductive layer, no gap is formed in the second conductive layer, thereby avoiding forming a gap in the conductive layer. Therefore, when a bit line structure and an isolation side wall are formed subsequently, the isolation side wall will not be damaged, thereby avoiding the electric connection between a capacitor contact structure and a bit line, and improving the yield of the semiconductor structure.

In order to make the objectives, features and advantages of the embodiments of the present disclosure clearer, the technical solutions in the embodiments of the present disclosure are described clearly and completely below with reference to the drawings in the embodiments of the present disclosure. Apparently, the described embodiments are merely a part rather than all of the embodiments of the present disclosure. All other embodiments obtained by those of ordinary skill in the art based on the embodiments of the disclosure without creative efforts shall fall within the protection scope of the present disclosure.

Figure 3:
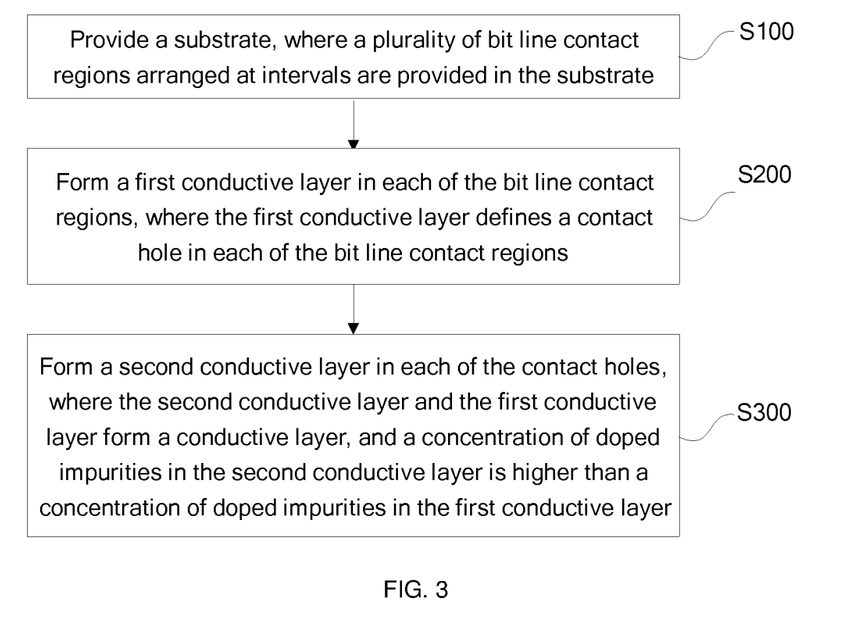
FIG. 3 is a flowchart of a manufacturing method of a semiconductor structure according to an embodiment of the present disclosure.

FIG. 3 is a flowchart of a manufacturing method of a semiconductor structure according to an embodiment of the present disclosure. FIG. 4 to FIG. 10 are schematic diagrams of various stages in a manufacturing method of a semiconductor structure. The manufacturing method of a semiconductor structure will be described in detail below with reference to FIG. 4 to FIG. 10.

The semiconductor structure is not limited in this embodiment. The semiconductor structure is described below by taking a dynamic random access memory (DRAM) as an example, but this embodiment is not limited to this, and the semiconductor structure in this embodiment may also be other structure.

As shown in FIG. 3, an embodiment of the present disclosure provides a manufacturing method of a semiconductor structure, including the following steps:

Step S100: Provide a substrate, where a plurality of bit line contact regions arranged at intervals are provided in the substrate.

Figure 4:
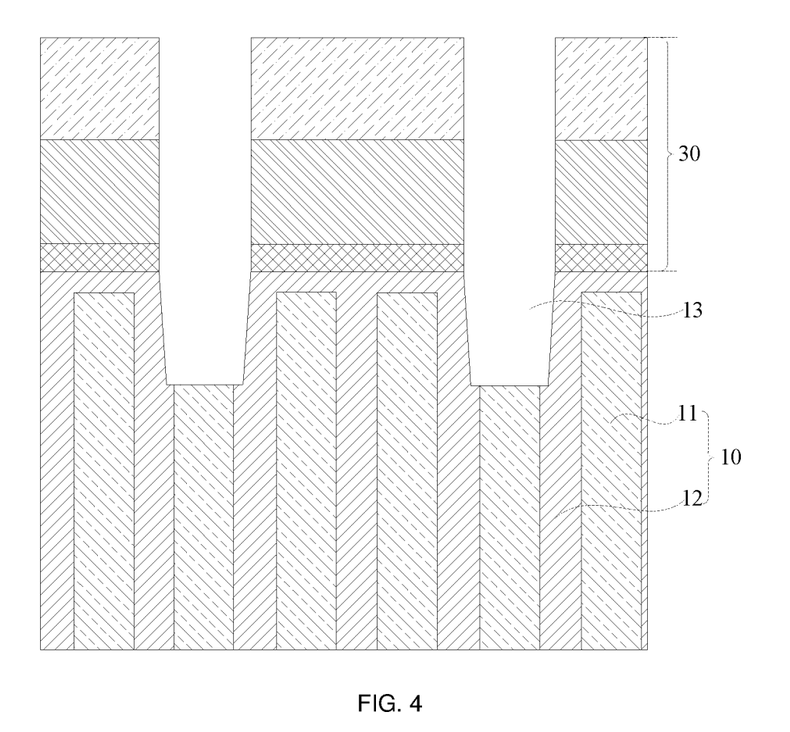
FIG. 4 is a schematic structural diagram of forming a bit line contact region in a manufacturing method of a semiconductor structure according to an embodiment of the present disclosure.

For example, as shown in FIG. 4, a substrate 10 serves as a support member of the DRAM and is used to support other components thereon. The substrate 10 may be made of a semiconductor material. The semiconductor material may be one or more of a group consisting of silicon, germanium, a silicon-germanium compound, and a silicon-carbon compound.

The substrate 10 is provided with a plurality of active regions 11 and isolation structures 12 for isolating the active regions 11. The plurality of active regions 11 may be arranged at intervals. The active region 11 is used for disposing a semiconductor device, such as a transistor and a capacitor.

A manufacturing process of the isolation structures 12 generally includes: patterning the substrate 10 to form isolation trenches in the substrate 10, then depositing silicon oxide in the isolation trenches by using a deposition process, to form the isolation structures 12. The isolation structures 12 are used for insulating the active regions 11 from each other.

The substrate 10 is provided with a plurality of bit line contact regions 13. The plurality of bit line contact regions 13 may be arranged at intervals in the substrate 10. During forming of the plurality of bit line contact regions 13, a patterned mask layer 30 may be formed on the substrate 10. Then, with the mask layer 30 as a mask, the substrate 10 is removed by a certain thickness by using an etching gas or an etching liquid, to form the bit line contact regions 13 in the substrate 10.

During forming of the patterned mask layer 30, a photoetching layer with a specific thickness may be coated on the mask layer 30, and then a mask pattern is formed on the photoetching layer through exposure, etching, and development. Next, the mask layer 30 not covered by the mask pattern is removed by using an etching liquid or an etching gas, to form a pattern in the mask layer 30.

The mask layer 30 may be a single film layer or a composite film layer. For example, the mask layer 30 may include a silicon nitride layer, a polysilicon layer, and a silicon oxide layer that are sequentially stacked. The silicon nitride layer is disposed on the substrate 10. In this embodiment, the mask layer 30 is a composite film layer, so that the pattern is first transferred to the silicon oxide layer, and then transferred to the polysilicon is layer, the silicon nitride layer, and the substrate 10 in sequence in a pattern transfer process, thereby improving the accuracy of the pattern transfer process and ensuring the accuracy of the pattern of the bit line contact region 13.

It should be noted that, after the bit line contact region 13 is formed, a protective layer 40 may be formed in the bit line contact region 13, or the conductive layer 20 may be formed directly. In the following embodiment, forming the protective layer 40 in the bit line contact region 13 is taken as an example for illustration.

Figure 5:
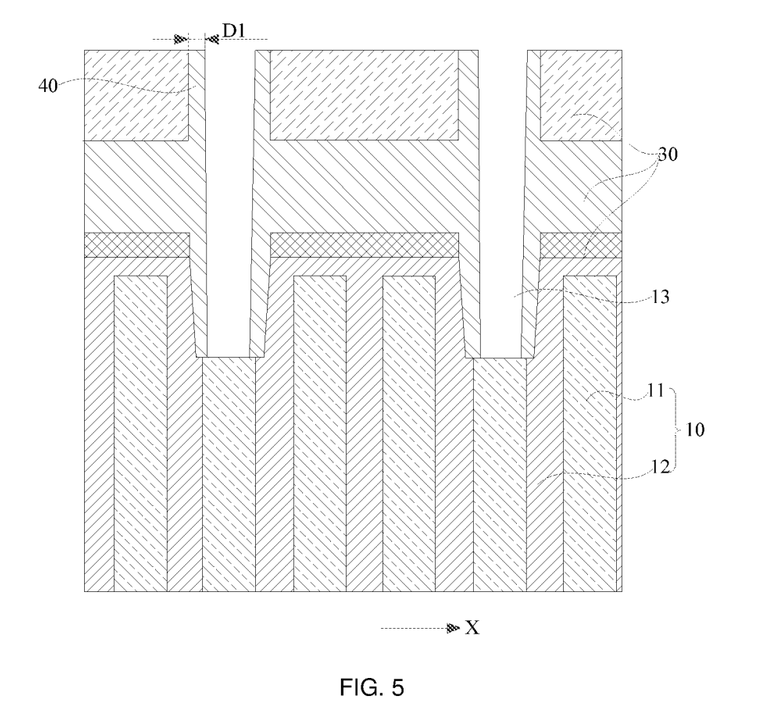
FIG. 5 is a schematic structural diagram of forming a protective layer in a manufacturing method of a semiconductor structure according to an embodiment of the present disclosure.

For example, as shown in FIG. 5, the protective layer 40 is formed on a sidewall of the bit line contact region 13. The protective layer 40 is used for protecting the isolation structure 12 exposed in the bit line contact region 13, to prevent damage on the isolation structure 12 when the bit line contact region 13 is cleaned subsequently. A material of the protective layer 40 includes polysilicon.

In this embodiment, a thickness of the protective layer 40 ranges from 3 nm to 6 nm. As shown in FIG. 5, the protective layer 40 has a certain thickness D1 in direction X, where the thickness D1 ranges from 3 nm to 6 nm.

If the thickness of the protective layer 40 is less than 3 nm, the protective layer 40 is excessively thin. As a result, the isolation structure 12 will still be damaged when the bit line contact region 13 is subsequently cleaned. If the thickness of the protective layer 40 is greater than 6 nm, an area of a region defined by the protective layer 40 is excessively small, which increases the depth-to-width ratio of the region. As a result, the subsequently formed bit line contact structure will still have a gap.

Therefore, the thickness of the protective layer 40 is limited in this embodiment, which not only protects the isolation structure 12 but also prevents a gap in the bit line contact structure, thereby avoiding an electric connection between the capacitor contact structure and the bit line structure and improving the yield of the semiconductor structure.

Step S200: Form a first conductive layer in each of the bit line contact regions, where the first conductive layer defines a contact hole in each of the bit line contact regions.

The first conductive layer 21 is formed through a deposition process. For example, the deposition process may include at least one of a physical vapor deposition process, a chemical vapor deposition process, and an atomic layer deposition process.

Figure 9:
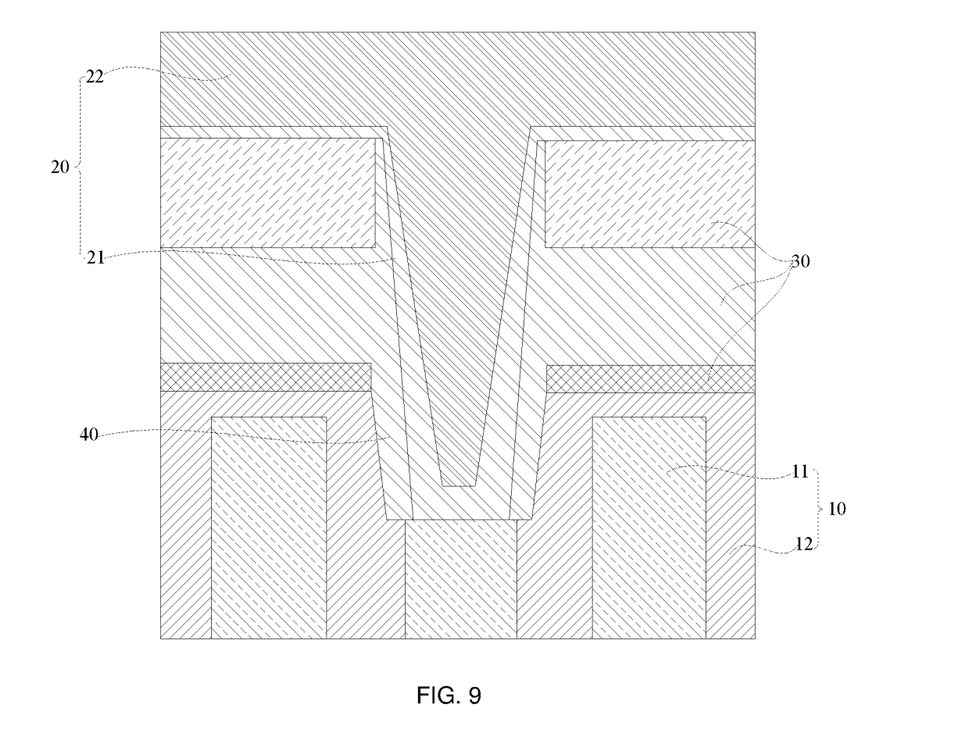
FIG. 9 is a first schematic structural diagram of forming a second conductive layer in a manufacturing method of a semiconductor structure according to an embodiment of the present disclosure.
Figure 10:
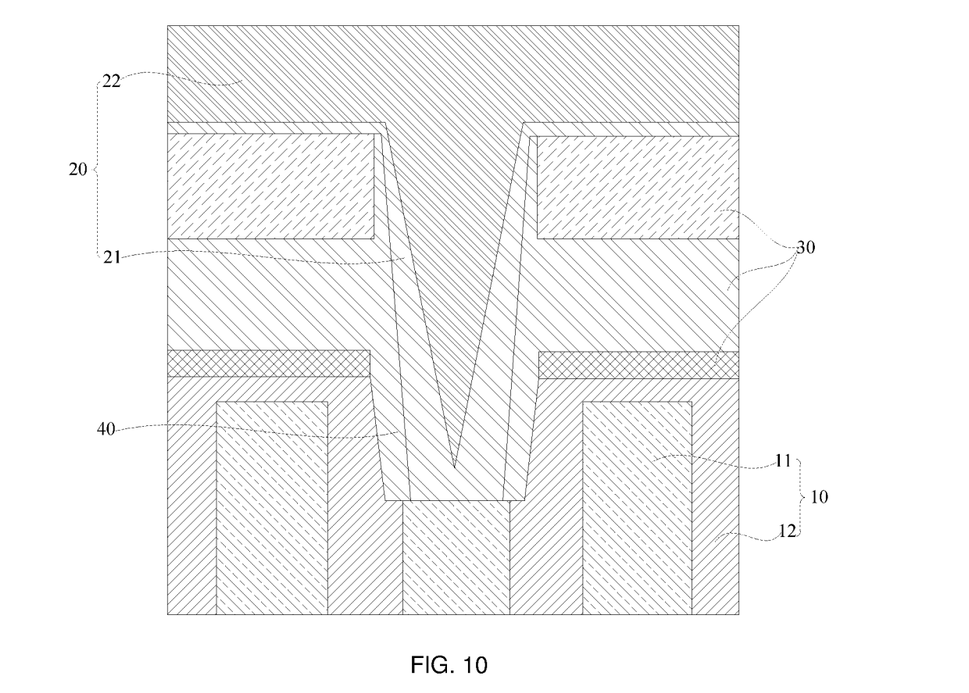
FIG. 10 is a second schematic structural diagram of forming a second conductive layer in a manufacturing method of a semiconductor structure according to an embodiment of the present disclosure.

Step S300: Form a second conductive layer in each of the contact holes, where the second conductive layer and the first conductive layer form a conductive layer, a concentration of doped impurities in the second conductive layer is higher than a concentration of doped impurities in the first conductive layer, and the structure is as shown in FIG. 9 and FIG. 10.

The second conductive layer 22 may also be formed through a deposition process. For example, the deposition process may include at least one of a physical vapor deposition process, a chemical vapor deposition process, and an atomic layer deposition process.

In this embodiment, materials of the first conductive layer 21 and the second conductive layer 22 are polysilicon, and the doped impurities are phosphorus ions. The concentration of the doped impurities in the second conductive layer 22 is 1.5 to 3 times the concentration of the doped impurities in the first conductive layer 21.

For example, the concentration of the doped impurities in the first conductive layer 21 is 1E20 to 10E20. That is, the concentration of the doped impurities in the first conductive layer 21 is $1*10^{20}$ to $10*10^{20}$. The concentration of the doped impurities in the second conductive layer 22 is 15E20 to 30E20. That is, the concentration of the doped impurities in the second conductive layer 22 is $15*10^{20}$ to $30*10^{20}$.

Compared with the prior art in which the conductive layer 20 is formed through one deposition process, in this embodiment, the conductive layer 20 is formed through two deposition processes. That is, the first deposition process is used for forming the first conductive layer 21, and the second deposition process is used for forming the second conductive layer 22, where a concentration of doped impurities in the first conductive layer 21 is lower than a concentration of doped impurities in the second conductive layer 22. Because a lower concentration of doped impurities corresponds to a higher filling capability, no gap is formed during forming of the first conductive layer 21. In addition, the contact hole 25 is defined in the bit line contact region 13 of the first conductive layer 21, and the contact hole 25 has a low depth-to-width ratio. In this way, during forming of the second conductive layer 22, no gap is formed in the second conductive layer 22, thereby avoiding forming a gap in the conductive layer 20. Therefore, when the bit line structure and the isolation side wall are formed subsequently, the isolation side wall will not be damaged, thereby avoiding the electric connection between the capacitor contact structure and the bit line, and improving the yield of the semiconductor structure.

In addition, the high concentration of the doped impurities in the second conductive layer 22 can improve the conductivity of the second conductive layer 22, thereby improving the conductivity of the conductive layer 20 and the performance of the semiconductor structure.

In some embodiments, the process of forming a first conductive layer 21 in each of the bit line contact regions 13 may be implemented in the following manner.

Figure 6:
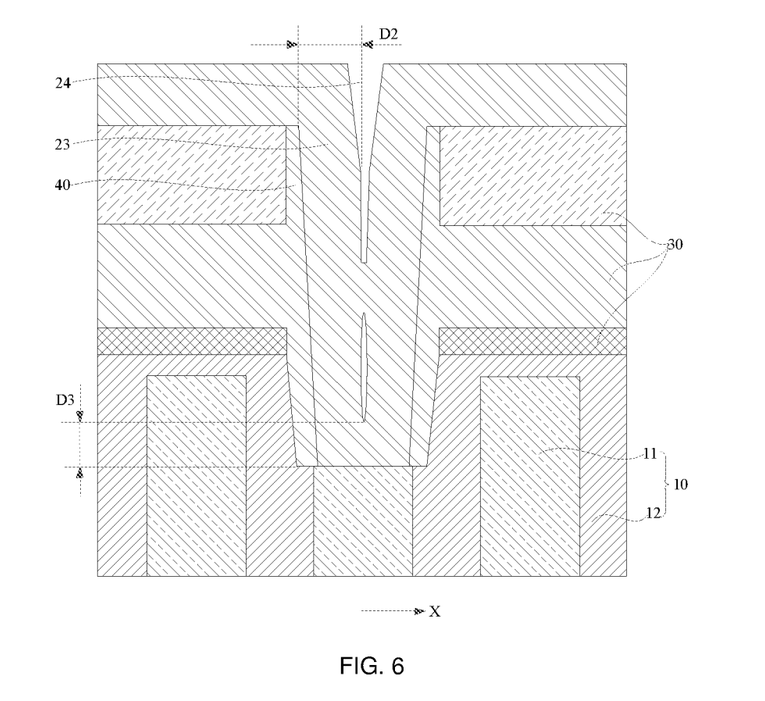
FIG. 6 is a schematic structural diagram of forming a first initial conductive layer in a manufacturing method of a semiconductor structure according to an embodiment of the present disclosure.

For example, as shown in FIG. 6, a first initial conductive layer 23 is formed in each of the bit line contact regions 13 by using a deposition process. The first initial conductive layer 23 extends to the outside of the bit line contact region 13 and covers the mask layer 30. The first initial conductive layer 23 defines an intermediate hole 24 in each of the bit line contact regions 13.

In this embodiment, the deposition process may include at least one of a physical vapor deposition process, a chemical vapor deposition process, and an atomic layer deposition process.

In a first direction, a thickness of the first initial conductive layer 23 ranges from 5 nm to 18 nm. The thickness of the first initial conductive layer 23 is D2 as shown in FIG. 6. If the thickness of the first initial conductive layer 23 is less than 5 nm, it makes it difficult to form the first conductive layer 21 subsequently. If the thickness of the first initial conductive layer 23 is greater than 18 nm, the first initial conductive layer 23 is excessively thick, which makes it difficult to form the intermediate hole 24 and subsequently remove the first initial conductive layer 23. Therefore, in this embodiment, the thickness of the first initial conductive layer 23 is limited in the range of 5 nm to 18 nm, which not only facilitates forming of the first conductive layer 21 but also reduces the manufacturing difficulty of the first conductive layer 21.

The first direction may be direction X in FIG. 6.

In addition, a thickness of the first initial conductive layer 23 on a bottom wall of the bit line contact region 13 ranges from 10 nm to 18 nm. The thickness of the first initial is conductive layer 23 on the bottom wall of the bit line contact region 13 is D3 as shown in FIG. 6.

If the thickness of the first initial conductive layer 23 on the bottom wall of the bit line contact region 13 is less than 10 nm, the subsequently formed first conductive layer 21 is excessively thin in a direction perpendicular to the substrate 10, and thus the contact hole 25 is still very deep, which may cause a gap in the subsequently formed second conductive layer 22.

If the thickness of the first initial conductive layer 23 on the bottom wall of the bit line contact region 13 is greater than 18 nm, the depth of the subsequently formed contact hole 25 is reduced, which leads to low conductivity of the subsequently formed second conductive layer 22, thus reducing the conductivity of the conductive layer 20.

Therefore, in this embodiment, the thickness of the first initial conductive layer 23 on the bottom wall of the bit line contact region 13 is limited in a range of 10 nm to 18 nm, which not only avoids forming a gap in the second conductive layer 22 but also improves the conductivity of the conductive layer 20, thereby improving the performance of the semiconductor structure.

Figure 7:
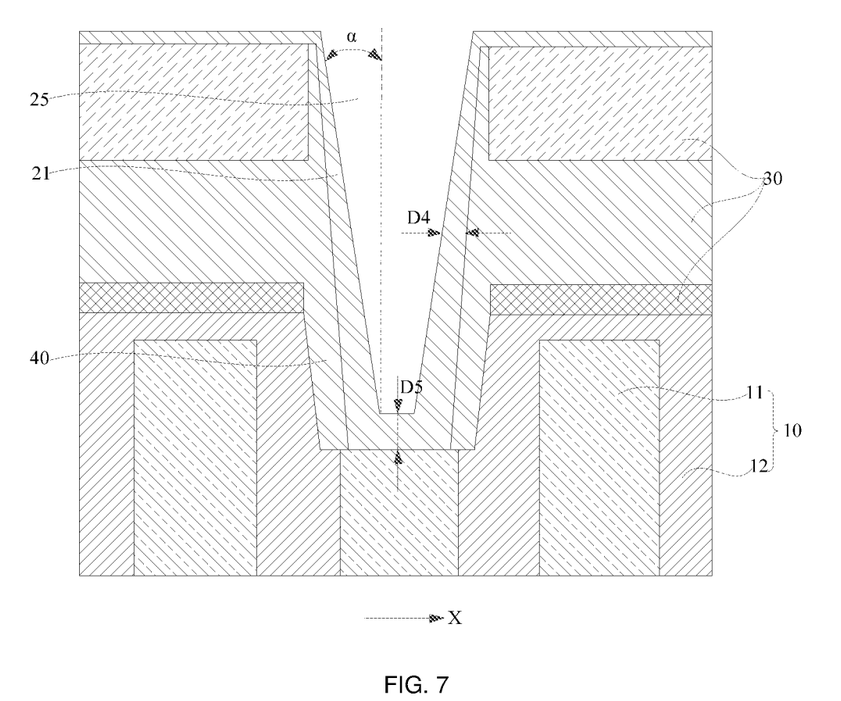
FIG. 7 is a first schematic structural diagram of forming a contact hole in a manufacturing method of a semiconductor structure according to an embodiment of the present disclosure.

As shown in FIG. 7, after the first initial conductive layer 23 is formed, an etching gas is introduced into the intermediate hole 24. The etching gas can remove a part of the first initial conductive layer 23, the retained first initial conductive layer 23 forms the first conductive layer 21, and the first conductive layer 21 defines the contact hole 25 in the bit line contact region.

The etching gas includes chlorine, and an etching temperature ranges from 250° C. to 320° C. An etching temperature lower than 250° C. will reduce an etching rate and an etching time, thus increasing the production cost. An etching temperature higher than 320° C. easily causes over-etching of the first initial conductive layer 23 and reduces the thickness of the first conductive layer 21, and thus the contact hole 25 still has a high depth-to-width ratio. Therefore, in this embodiment, the etching temperature is limited, which not only reduces the production cost but also reduces the depth-to-width ratio of the contact hole 25, thereby avoiding forming a gap in the bit line contact structure.

Figure 8:
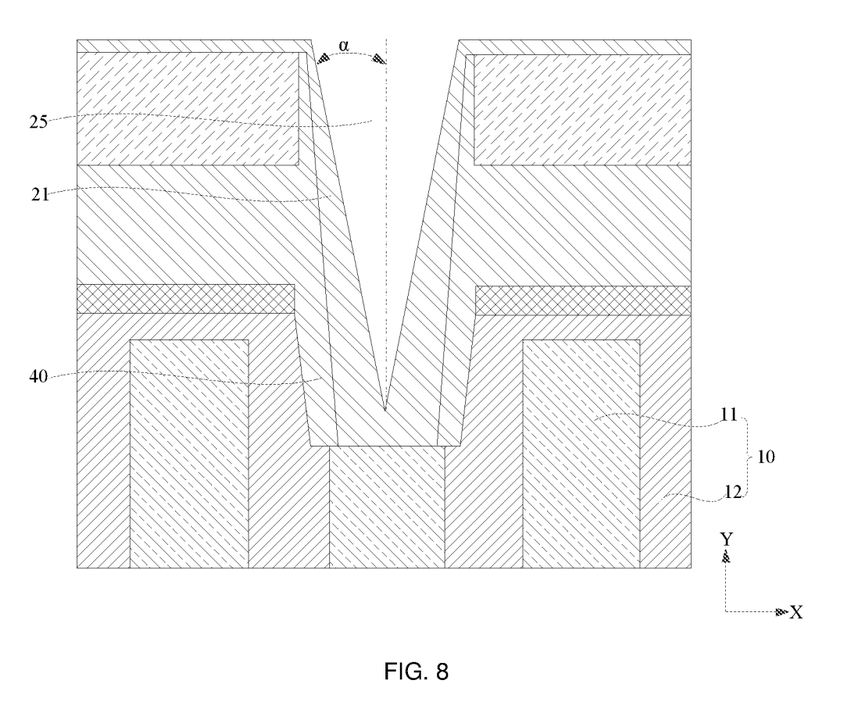
FIG. 8 is a second schematic structural diagram of forming a contact hole formed in a manufacturing method of a semiconductor structure according to an embodiment of the present disclosure.

In this embodiment, the contact hole 25 may be in various shapes. For example, with a section in a direction perpendicular to the substrate 10 as a longitudinal section, the longitudinal section of the contact hole 25 is in a shape of a trapezoid with a large top and a small bottom, where the structure is as shown in FIG. 7. In another example, with a section in a direction perpendicular to the substrate 10 as a longitudinal section, the longitudinal section of the contact hole 25 is V-shaped, where the structure is as shown in FIG. 8. In this embodiment, the shape of the contact hole 25 is limited, which can facilitate subsequent deposition of the second conductive layer 22 and avoid forming a gap in the second conductive layer 22.

In some embodiments, as shown in FIG. 7 and FIG. 8, an angle between a sidewall of the contact hole 25 and the direction perpendicular to the substrate 10 ranges from 10° to 20°; an angle between the sidewall of the contact hole 25 and direction Y is a in FIG. 7 and FIG. 8.

If the angle between the sidewall of the contact hole 25 and the direction perpendicular to the substrate 10 is less than 10°, a top opening of the contact hole 25 is excessively small, which increases the difficulty of subsequently depositing the second conductive layer 22, and a gap will still be formed in the second conductive layer 22.

If the angle between the sidewall of the contact hole 25 and the direction perpendicular to the substrate 10 is greater than 20°, the contact hole 25 is not deep enough, which causes the subsequently formed second conductive layer 22 to be excessively thin and reduces the conductivity of the second conductive layer 22, thus reducing the conductivity of the conductive layer 20 and the performance of the semiconductor structure.

Therefore, the angle between the sidewall of the contact hole 25 and the direction perpendicular to the substrate 10 is limited in this embodiment, which not only avoids forming a gap in the second conductive layer 22 but also increases the conductivity of the conductive layer 20.

In some embodiments, in the first direction, a thickness of the first conductive layer 21 ranges from 0 nm to 6 nm. In direction X in FIG. 7, the thickness of the first conductive layer 21 is D4, and the thickness D4 of the first conductive layer 21 ranges from 0 nm to 6 nm. The thickness of the first conductive layer 21 may be a constant value, that is, the is thickness of the first conductive layer 21 remains unchanged at each position in the direction perpendicular to the substrate 10. In the direction perpendicular to the substrate 10, the thickness of the first conductive layer 21 may be change gradually. For example, as shown in FIG. 7, the thickness of the first conductive layer 21 at the top of the contact hole 25 may range from 0 nm to 3 nm, and the thickness of the first conductive layer 21 at the bottom of the contact hole 25 may range from 3 nm to 6 nm.

The thickness of the first conductive layer 21 is limited in this embodiment, which not only avoids forming a gap in the first conductive layer 21 but also ensures the conductivity of the conductive layer 20, thereby improving the performance of the semiconductor structure.

In some embodiments, further referring to FIG. 7, a thickness of the first conductive layer 21 on a bottom wall of the bit line contact region 13 ranges from 5 nm to 8 nm.

In the direction perpendicular to the substrate 10, a thickness D5 of the first conductive layer 21 ranges from 5 nm to 8 nm. If the thickness D5 of the first conductive layer 21 is less than 5 nm, the contact hole 25 will still have a high depth-to-width ratio. As a result, during forming of the second conductive layer 22, a gap is easily formed in the second conductive layer 22, thus leasing to an electric connection between the subsequently formed capacitor contact structure and the bit line structure and reducing the yield of the semiconductor structure.

If the thickness D5 of the first conductive layer 21 is greater than 8 nm, the contact hole 25 is not deep enough, which may cause the formed second conductive layer 22 to be excessively thin and reduce the conductivity of the second conductive layer 22, thus reducing the conductivity of the conductive layer 20 and the performance of the semiconductor structure.

Therefore, the thickness of the first conductive layer 21 in the direction perpendicular to the substrate 10 is limited in this embodiment, which not only avoids an electric connection between the subsequently formed capacitor contact structure and the bit line structure and improves the yield of the semiconductor structure, but also ensures the conductivity of the conductive layer 20 and improves the performance of the semiconductor structure.

According to a second aspect, an embodiment of the present disclosure provides a semiconductor structure, which is manufactured using the manufacturing method of a semiconductor structure in the foregoing embodiment. Therefore, in this embodiment, a bit line contact structure in the semiconductor structure includes a first conductive layer 21 and a second conductive layer 22 that are sequentially stacked, and the first conductive layer 21 and the second conductive layer 22 are dense structures without any gap. In this way, during subsequent forming of a bit line and an isolation side wall, the isolation side wall will not be damaged, thus avoiding an electric connection between a capacitor contact structure and a bit line structure, and improving the yield of the semiconductor structure.

In addition, the concentration of doped impurities in the second conductive layer 22 is relatively high, which not only avoids the gap in the second conductive layer 22 but also improves the conductivity of the second conductive layer 22, thereby improving the conductivity of the bit line contact structure and the performance of the semiconductor structure.

The embodiments or implementations of this specification are described in a progressive manner, and each embodiment focuses on differences from other embodiments. The same or similar parts between the embodiments may refer to each other.

In the descriptions of this specification, a description with reference to the term "one implementation", "some implementations", "an exemplary implementation", "an example", "a specific example", "some examples", or the like means that a specific feature, structure, material, or characteristic described in combination with the implementation(s) or example(s) is included in at least one implementation or example of the present disclosure.

In this specification, the schematic expression of the above terms does not necessarily refer to the same embodiment or example. Moreover, the described specific feature, structure, material or characteristic may be combined in an appropriate manner in any one or more implementations or examples.

Finally, it should be noted that the foregoing embodiments are used only to explain is the technical solutions of the present disclosure, but are not intended to limit the present disclosure. Although the present disclosure has been described in detail with reference to the foregoing embodiments, those of ordinary skill in the art should understand that they can still modify the technical solutions described in the foregoing embodiments, or make equivalent substitutions on some or all technical features therein. The modifications or substitutions do not make the essence of the corresponding technical solutions deviate from the scope of the technical solutions of the embodiments of the present disclosure.

The invention claimed is:

1. A manufacturing method of a semiconductor structure, comprising:
    providing a substrate, wherein a plurality of bit line contact regions arranged at intervals are provided in the substrate;
    forming a first conductive layer in each of the bit line contact regions, wherein the first conductive layer defines a contact hole in each of the bit line contact regions; and
    forming a second conductive layer in each of the contact holes, wherein the second conductive layer and the first conductive layer form a conductive layer, and a concentration of doped impurities in the second conductive layer is higher than a concentration of doped impurities in the first conductive layer.

2. The manufacturing method of a semiconductor structure according to claim 1, wherein the concentration of the doped impurities in the second conductive layer is 1.5 to 3 times the concentration of the doped impurities in the first conductive layer.

3. The manufacturing method of a semiconductor structure according to claim 1, wherein the forming a first conductive layer in each of the bit line contact regions comprises:
    forming a first initial conductive layer in each of the bit line contact regions, wherein the first initial conductive layer defines an intermediate hole in each of the bit line contact regions; and
    introducing an etching gas into the intermediate hole, and removing a part of the first initial conductive layer, wherein the retained first initial conductive layer forms the first conductive layer, and the first conductive layer defines the contact hole in the bit line contact region.

4. The manufacturing method of a semiconductor structure according to claim 3, wherein with a section in a direction perpendicular to the substrate as a longitudinal section, the longitudinal section of the contact hole is in a shape of trapezoid with a large top and a small bottom.

5. The manufacturing method of a semiconductor structure according to claim 3, wherein with a section in a direction perpendicular to the substrate as a longitudinal section, the longitudinal section of the contact hole is V-shaped.

6. The manufacturing method of a semiconductor structure according to claim 5, wherein an angle between a sidewall of the contact hole and the direction perpendicular to the substrate ranges from 10° to 20°.

7. The manufacturing method of a semiconductor structure according to claim 3, wherein a thickness of the first initial conductive layer ranges from 5 nm to 18 nm in a first direction.

8. The manufacturing method of a semiconductor structure according to claim 7, wherein a thickness of the first initial conductive layer on a bottom wall of the bit line contact region ranges from 10 nm to 18 nm.

9. The manufacturing method of a semiconductor structure according to claim 3, wherein the etching gas comprises chlorine, and an etching temperature ranges from 250° C. to 320° C.

10. The manufacturing method of a semiconductor structure according to claim 1, wherein a thickness of the first conductive layer ranges from 0 nm to 6 nm in a first direction.

11. The manufacturing method of a semiconductor structure according to claim 10, wherein a thickness of the first conductive layer on a bottom wall of the bit line contact region ranges from 5 nm to 8 nm.

12. The manufacturing method of a semiconductor structure according to claim 1, wherein materials of the first conductive layer and the second conductive layer comprise polysilicon, and the doped impurities are phosphorus ions.

13. The manufacturing method of a semiconductor structure according to claim 1, wherein before the forming a first conductive layer in each of the bit line contact regions, the manufacturing method further comprises:
    forming a protective layer on a sidewall of each of the bit line contact regions.

14. The manufacturing method of a semiconductor structure according to claim 13, wherein a thickness of the protective layer ranges from 3 nm to 6 nm, and a material of the protective layer comprises polysilicon.

* * * * *